United States Patent
Kim

(10) Patent No.: US 11,941,292 B2
(45) Date of Patent: Mar. 26, 2024

(54) MEMORY SYSTEM AND OPERATING METHOD THEREOF

(71) Applicant: SK hynix Inc., Icheon (KR)

(72) Inventor: Jae Hoon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 305 days.

(21) Appl. No.: 17/493,657

(22) Filed: Oct. 4, 2021

(65) Prior Publication Data

US 2022/0374170 A1  Nov. 24, 2022

(30) Foreign Application Priority Data

May 21, 2021 (KR) .................. 10-2021-0065345

(51) Int. Cl.
  *G06F 3/06* (2006.01)
  *G11C 7/10* (2006.01)
  *G11C 8/18* (2006.01)

(52) U.S. Cl.
  CPC .......... *G06F 3/0659* (2013.01); *G06F 3/0604* (2013.01); *G06F 3/0653* (2013.01); *G06F 3/0679* (2013.01); *G11C 7/1066* (2013.01); *G11C 8/18* (2013.01)

(58) Field of Classification Search
  CPC .................................................... G11C 7/1066
  See application file for complete search history.

(56) References Cited

U.S. PATENT DOCUMENTS

| | | | |
|---|---|---|---|
| 10,467,158 B2 | 11/2019 | Kim et al. | |
| 2009/0198858 A1* | 8/2009 | Ban | G11C 7/1009 710/307 |
| 2009/0327792 A1* | 12/2009 | Salmon | G06F 1/06 713/600 |
| 2018/0246665 A1* | 8/2018 | Wang | G06F 13/1678 |

* cited by examiner

*Primary Examiner* — Douglas King

(57) ABSTRACT

A memory system includes a host circuit and a memory circuit. The host circuit controls a bandwidth of a command-address signal based on data driving cycle information. The memory circuit performs an input/output operation based on the command-address signal.

16 Claims, 5 Drawing Sheets

MEMORY SYSTEM AND OPERATING METHOD THEREOF

CROSS-REFERENCES TO RELATED APPLICATION

The present application claims priority under 35 U.S.C. § 119(a) to Korean patent application number 10-2021-0065345, filed on May 21, 2021, in the Korean Intellectual Property Office, which is incorporated herein by reference in its entirety.

BACKGROUND

1. Technical Field

Various embodiments generally relate to a memory system and an operating method thereof, and more particularly, to a memory system including a host circuit, which provides a command-address signal, and a memory circuit, which inputs/outputs a data signal based on the command-address signal, and an operating method thereof.

2. Related Art

In general, memory devices are generally classified into a volatile memory device and a nonvolatile memory device. The volatile memory device has a disadvantage in that data stored therein is lost when power supply is cut off, but has an advantage in that memory cells in which data is stored have a high degree of integration and a high operation speed. Examples of the volatile memory device include an SRAM (static RAM), a DRAM (dynamic RAM), and an SDRAM (synchronous DRAM). The nonvolatile memory device has an advantage in that data stored therein is maintained even when power supply is cut off, but has a disadvantage in that a degree of integration and an operation speed are lower than those of the volatile memory device. Examples of the nonvolatile memory device include a ROM (read only memory), a PROM (programmable ROM), an EPROM (electrically programmable ROM), an EEPROM (electrically erasable and programmable ROM), a flash memory, a PRAM (phase change RAM), an MRAM (magnetic RAM), an RRAM (resistive RAM), and an FRAM (ferroelectric RAM).

As processes and design technologies for a memory device are remarkably developed, the operation speed of the memory device is gradually increasing, and the size of the memory device is gradually decreasing. The number of pads provided in the memory device is gradually decreasing in step with such a development situation of the memory device. Therefore, there is a need to propose various control methods according to a decrease in the number of pads in signal transmission between a host device and the memory device.

SUMMARY

In an embodiment, a memory system may include: a host circuit configured to control a bandwidth of a command-address signal based on data driving cycle information and transfer, to a memory circuit, the command-address signal with the bandwidth; and the memory circuit configured to perform an input/output operation of a data signal based on the command-address signal and the data driving cycle information.

The data driving cycle information may include information on a time during which the data signal occupies an input/output pad when the data signal is driven to the input/output pad.

In an embodiment, a memory system may include: a memory circuit configured to provide data driving cycle information; and a host circuit configured to control an input/output operation of a data signal, which is performed by the memory circuit, and transfer, to the memory circuit, a command-address signal with a bandwidth controlled based on the data driving cycle information that is provided by the memory circuit.

In an embodiment, a method for operating a memory system including a host circuit and a memory circuit, the method may include: obtaining, by the host circuit, data driving cycle information for the memory circuit; setting, by the host circuit, a bandwidth of a command-address signal based on the data driving cycle information; transferring, by the host circuit, the command-address signal with the bandwidth to the memory circuit; and performing, by the memory circuit, an input/output operation of a data signal based on the command-address signal.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments are directed to a memory system and an operating method thereof, capable of controlling a bandwidth of a command-address signal transferred from a host circuit to a memory circuit.

Figure 1:
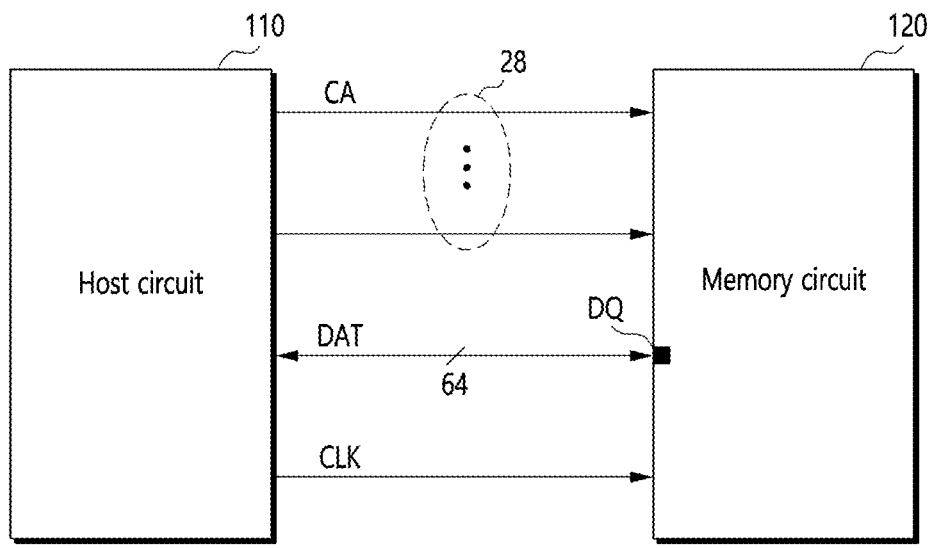
FIG. 1 is a block diagram illustrating a memory system in accordance with an embodiment.

FIG. 1 is a block diagram illustrating a memory system 100 in accordance with an embodiment.

Referring to FIG. 1, the memory system 100 may include a host circuit 110 and a memory circuit 120.

The host circuit 110 may be configured to control a write operation for storing data in the memory circuit 120 and a read operation for outputting data stored in the memory circuit 120. The host circuit 110 may provide one or more of a command-address signal CA, a data signal DAT, and a clock signal CLK to the memory circuit 120.

The command-address signal CA may include active command information and row address information. The memory circuit 120 may activate a word line (not illustrated) corresponding to the row address information, based on the command-address signal CA. The command-address signal CA may include column command information and column address information. The memory circuit 120 may activate an amplifier circuit (not illustrated) coupled to a bit line (not illustrated) corresponding to the column address information, based on the command-address signal CA. The memory circuit 120 may perform a write operation and a read operation by performing the operation of activating the word line and the operation of activating the amplifier circuit coupled to the bit line.

The host circuit 110 may be configured to control a bandwidth of the command-address signal CA based on data driving cycle information. For the sake of convenience in explanation, it is exemplified that 28 transmission lines are coupled between the host circuit 110 and the memory circuit 120 to transfer the command-address signal CA. That is to say, a maximum bandwidth of the command-address signal CA transferred from the host circuit 110 to the memory circuit 120 may be 28.

The host circuit 110 may transfer 28 command-address signals CA through fewer than 28 transmission lines in correspondence to the data driving cycle information. As will be described later again, the data driving cycle information may include information on a time during which the data signal DAT occupies an input/output pad DQ when the data signal DAT is driven to the input/output pad DQ.

The time during which the data signal DAT occupies the input/output pad DQ may be changed depending on at least one of the number of command signals required for the data signal DAT to drive the input/output pad DQ and a burst length. In other words, the time during which the data signal DAT occupies the input/output pad DQ may be lengthened when the number of command signals required for the data signal DAT to drive the input/output pad DQ increases, and may be shortened when the number of command signals required for the data signal DAT to drive the input/output pad DQ decreases. The time during which the data signal DAT occupies the input/output pad DQ may be lengthened when the burst length increases, and may be shortened when the burst length decreases.

A time that represents a certain period in the host circuit 110 and the memory circuit 120 may be defined by counting toggling of the clock signal CLK, i.e., by a toggling number of the clock signal CLK. Namely, the data driving cycle information may be defined as the toggling number of the clock signal CLK corresponding to the time during which the data signal DAT occupies the input/output pad DQ. Therefore, the host circuit 110 may adjust the bandwidth of the command-address signal CA based on the toggling number of the clock signal CLK corresponding to the time during which the data signal DAT occupies the input/output pad DQ.

The memory circuit 120 may be configured to perform an input/output operation based on the command-address signal CA. The memory circuit 120 may input/output the data signal DAT based on the data driving cycle information during the input/output operation. The data signal DAT may be inputted to or outputted from the memory circuit 120 through the input/output pad DQ. The data signal DAT may be inputted from the host circuit 110 to the memory circuit 120 or be outputted from the memory circuit 120 to the host circuit 110, through, for example, 64 transmission lines.

As will be described in more detail with reference to FIG. 2, the memory system 100 may control the bandwidth of the command-address signal CA based on the data driving cycle information. In this regard, by adjusting the bandwidth of the command-address signal CA, the host circuit 110 may transfer the command-address signal CA and an additional signal to a plurality of transmission lines corresponding to the maximum bandwidth of the command-address signal CA.

The additional signal may be defined as a signal other than the command-address signal CA. The additional signal may include one or more of power, error correction information, information for other functions, and so forth, corresponding to the signal other than the command-address signal CA. That is to say, the plurality of transmission lines may transfer additional signals whose number is smaller than the maximum bandwidth, together with the command-address signal CA whose bandwidth is adjusted. For example, if the bandwidth of the command-address signal CA is adjusted to 20 in a state in which the maximum bandwidth of the command-address signal CA is 28, the remaining eight transmission lines may be used to transfer the additional signals.

In accordance with this embodiment, by adjusting the bandwidth of the command-address signal CA, the memory system 100 may transfer an additional signal without adding a transmission line for transferring the additional signal. Accordingly, the memory system 100 may improve the utilization efficiency of transmission lines.

Figure 2:
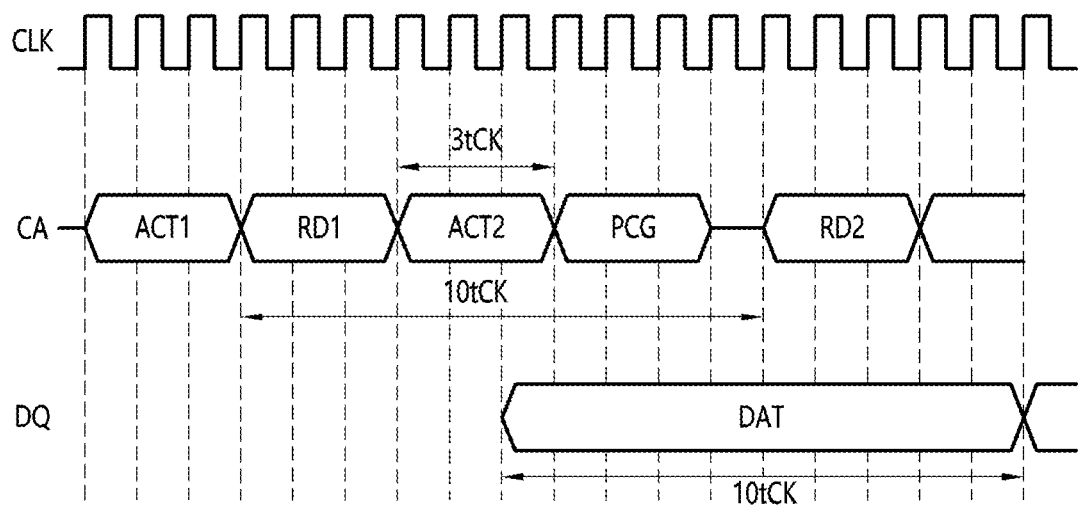
FIGS. 2 and 3 are timing diagrams illustrating an operation of the memory system of FIG. 1.
Figure 3:
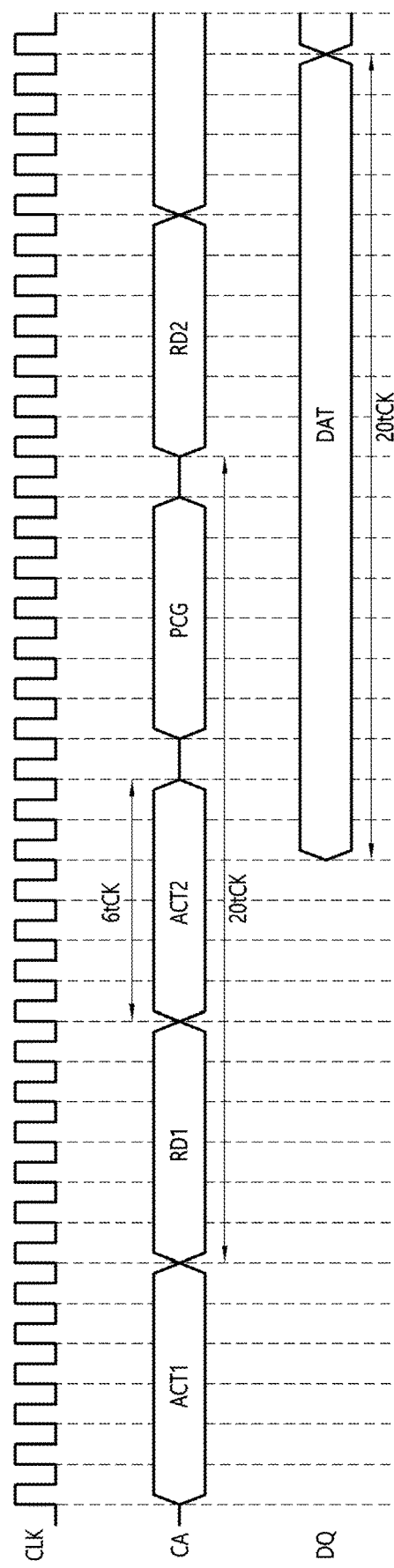

FIGS. 2 and 3 are timing diagrams illustrating an operation of the memory system 100 of FIG. 1. The memory circuit 120 of FIG. 1 may perform an operation based on various parameters defined in a specification. Among the various parameters, there is a CAS-to-CAS delay time tCCD. For reference, the CAS-to-CAS delay time tCCD defines a time from when a read command signal or a write command signal corresponding to column command information is inputted to when a next read command signal or a next write command signal is inputted.

FIG. 2 illustrates an example in which the CAS-to-CAS delay time tCCD corresponds to 10tCK. In other words, the memory circuit 120 may receive a first read command signal RD1 and then, after 10tCK, may receive a second read command signal RD2, through the command-address signals CA.

The memory circuit 120 may output the data signal DAT to the input/output pad DQ in response to the first read command signal RD1. FIG. 2 illustrates an example in which the data signal DAT is driven to the input/output pad DQ for the CAS-to-CAS delay time tCCD that corresponds to 10tCK. As described above, the data driving cycle information may be defined as a time during which the data signal DAT occupies the input/output pad DQ when the data signal DAT is driven to the input/output pad DQ, and this time may be defined as a toggling number of the clock signal CLK. Accordingly, in FIG. 2, the data driving cycle information may be 10tCK, which means that the toggling number of the clock signal CLK is 10.

The host circuit 110 may control the bandwidth of the command-address signal CA based on the data driving cycle information.

In this regard, FIG. 2 illustrates an example in which at least three command signals are received during 10tCK. Therefore, referring to FIG. 2, each of command signals such as the first and second read command signals RD1 and RD2, first and second active command signals ACT1 and ACT2, and a precharge command signal PCG transferred through the command-address signals CA may secure an input time corresponding to 3tCK at the maximum. Namely, when 28 command-address signals CA of FIG. 1 are transferred to the memory circuit 120, 3tCK may be secured for each command-address signal.

Therefore, the number of transmission lines used for the host circuit 110 of FIG. 1 to transfer the command-address signals CA may be 9.3, that is, 10, obtained by dividing the maximum bandwidth of 28 by 3tCK. That is to say, the host circuit 110 may control the bandwidth of the command-address signal CA to 10. Since the bandwidth of the command-address signal CA may be 10, only 10 transmission lines among 28 transmission lines may be used to transfer the command-address signals CA, and the remaining 18 transmission lines may be used to transfer additional signals. Being able to transfer additional signals without increasing the number of transmission lines may mean that the utilization efficiency of transmission lines may be improved.

By adjusting the bandwidth of the command-address signal CA, the memory system 100 in accordance with the embodiment may improve the utilization efficiency of the plurality of transmission lines coupled between the host circuit 110 and the memory circuit 120.

Next, FIG. 3 illustrates an example in which the CAS-to-CAS delay time tCCD corresponds to 20tCK. In other words, the memory circuit 120 of FIG. 1 may receive a first read command signal RD1 and then, after 20tCK, may receive a second read command signal RD2, through the command-address signals CA. FIG. 3 illustrates an example in which the data signal DAT is driven to the input/output pad DQ for the CAS-to-CAS delay time tCCD that corresponds to 20tCK. Accordingly, in FIG. 3, the data driving cycle information may be 20tCK.

In FIG. 3, because the data driving cycle information is 20tCK, each of command signals such as the first and second read command signals RD1 and RD2, first and second active command signals ACT1 and ACT2, and a precharge command signal PCG transferred through the command-address signals CA may secure an input time corresponding to 6tCK at the maximum. Namely, when 28 command-address signals CA of FIG. 1 are transferred to the memory circuit 120, 6tCK may be secured for each command-address signal.

Therefore, the number of transmission lines used for the host circuit 110 of FIG. 1 to transfer the command-address signals CA may be 4.7, that is, 5, obtained by dividing the maximum bandwidth of 28 by 6tCK. That is to say, the host circuit 110 may control the bandwidth of the command-address signal CA to 5. Since the bandwidth of the command-address signal CA may be 5, only five transmission lines among 28 transmission lines may be used to transfer the command-address signal CA, and the remaining 23 transmission lines may be used to transfer additional signals.

As illustrated in FIGS. 2 and 3, the host circuit 110 may transfer the precharge command signal PCG through the command-address signal CA. The precharge command signal PCG may not necessarily be included in the CAS-to-CAS delay time tCCD. Accordingly, the host circuit 110 may adjust the bandwidth of the command-address signal CA according to a first command set including an active command signal, a read or write command signal, and a precharge command signal, a second command set including an active command signal and a read or write command signal, and a third command set including a read or write command signal and a precharge command signal.

As shown above, the first command set may include three command signals, and each of the second and third command sets may include two command signals. Each of FIGS. 2 and 3 illustrates, as an example, the application of the first command set including the precharge command signal. If the second and third command sets each including two command signals are applied, each command signal therein may have a longer input time than each command signal in the first command set. That is to say, the host circuit 110 may adjust the bandwidth of the command-address signal CA depending on the number of command signals to be transferred to the memory circuit 120.

Figure 4:
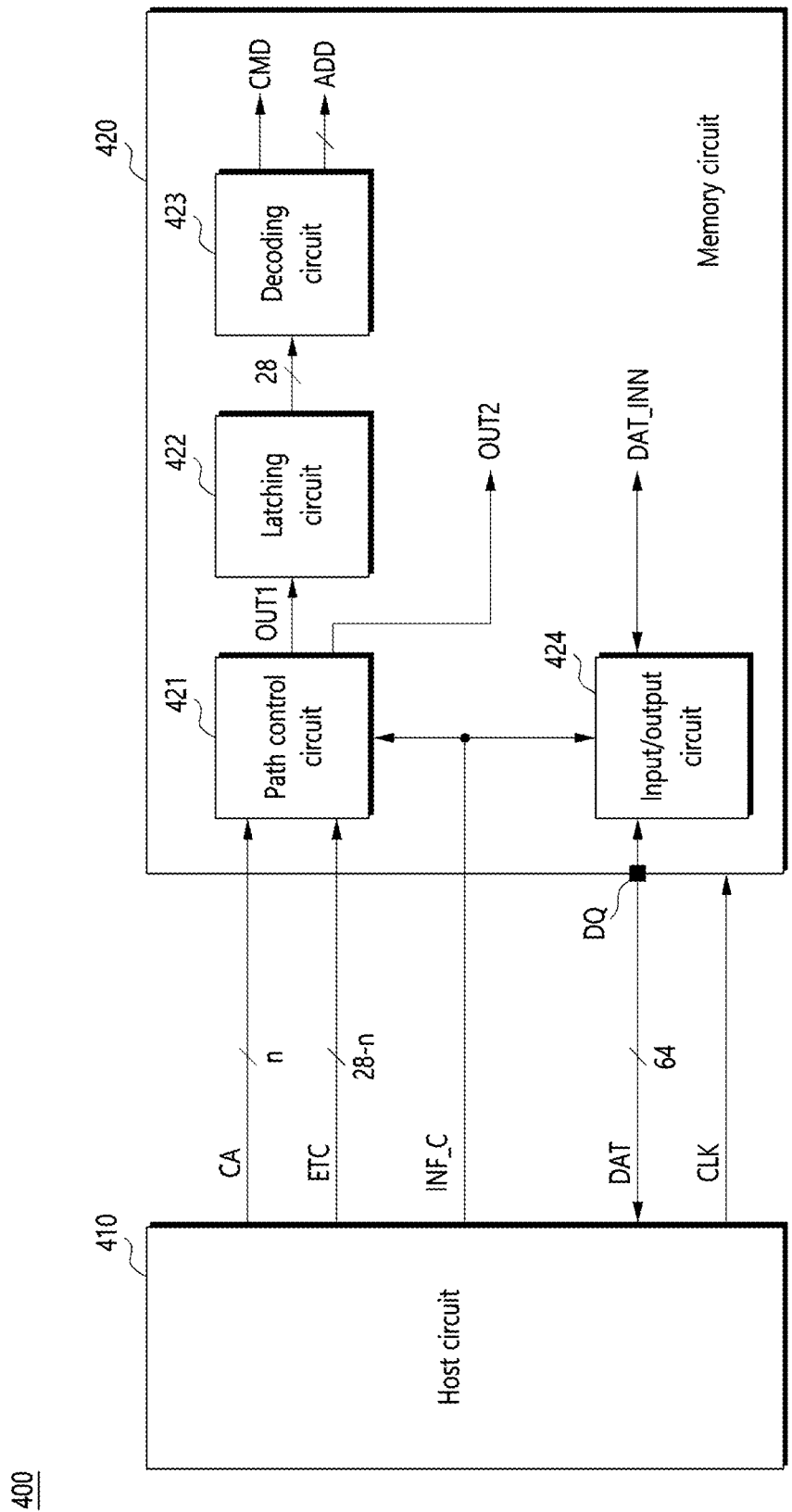
FIG. 4 is a block diagram illustrating a memory system in accordance with an embodiment.

FIG. 4 is a block diagram illustrating a memory system 400 in accordance with an embodiment.

Referring to FIG. 4, the memory system 400 may include a host circuit 410 and a memory circuit 420. The host circuit 410 may control a data driving cycle of the memory circuit 420.

The host circuit 410 may be configured to transfer a command-address signal CA with a bandwidth controlled based on data driving cycle information INF_C. The host circuit 410 may provide the command-address signal CA, an additional signal ETC, the data driving cycle information INF_C, and a clock signal CLK to the memory circuit 420, and may provide or receive a data signal DAT to or from the memory circuit 420 based on the command-address signal CA.

It is illustrated, as an example, that the bandwidth of the command-address signal CA is 28 at the maximum. Thus, when the bandwidth of the command-address signal CA is determined to be n (n is a natural number equal to or less than 28) based on the data driving cycle information INF_C, a bandwidth of the additional signal ETC may be 28-n.

The memory circuit 420 may be configured to perform an input/output operation based on the command-address signal CA. The memory circuit 420 may input/output the data signal DAT based on the data driving cycle information INF_C during the input/output operation. The memory circuit 420 may include a path control circuit 421, a latching circuit 422, a decoding circuit 423, and an input/output circuit 424.

The path control circuit 421 may be configured to control output paths of the command-address signal CA and the additional signal ETC based on the data driving cycle information INF_C. The path control circuit 421 may output the command-address signal CA as a first output signal OUT1 to the latching circuit 422 to be described below. The path control circuit 421 may output the additional signal ETC as a second output signal OUT2 to a corresponding internal circuit (not illustrated).

The latching circuit 422 may be configured to latch the command-address signal CA outputted from the path control circuit 421. In other words, the latching circuit 422 may receive and latch the first output signal OUT1 of the path control circuit 421. As described above with reference to FIG. 2, when the command-address signal CA is inputted for a time corresponding to 3tCK, the latching circuit 422 may latch the command-address signal CA inputted for 3tCK. As described above with reference to FIG. 3, when the command-address signal CA is inputted for a time corresponding to 6tCK, the latching circuit 422 may latch the command-address signal CA inputted for 6tCK.

The decoding circuit 423 may be configured to decode an output signal of the latching circuit 422 and generate a command signal CMD and an address signal ADD. The command signal CMD may be a signal corresponding to an active operation, a read operation, a write operation, a precharge operation, or the like. The address signal ADD may be a signal corresponding to a row address, a column address, or the like.

The input/output circuit 424 may be configured to input/output the data signal DAT based on the data driving cycle information INF_C. During a write operation, the input/output circuit 424 may receive the data signal DAT from the host circuit 410 through an input/output pad DQ and output the data signal DAT as an internal data signal DAT_INN to a memory device. During a read operation, the input/output circuit 424 may receive an internal data signal DAT_INN from the memory device and output the internal data signal DAT_INN as the data signal DAT to the host circuit 410 through the input/output pad DQ. As described above with reference to FIG. 2, the input/output circuit 424 may drive the input/output pad DQ for a time corresponding to 10tCK based on the data driving cycle information INF_C. As described above with reference to FIG. 3, the input/output circuit 424 may drive the input/output pad DQ for a time corresponding to 20tCK based on the data driving cycle information INF_C.

In the memory system 400 in accordance with the embodiment, the host circuit 410 may provide the data driving cycle information INF_C to control the memory circuit 420. The host circuit 410 may generate the command-address signal CA with a bandwidth controlled based on the data driving cycle information INF_C. The memory circuit 420 may perform a read operation and a write operation based on the command-address signal CA and the additional signal ETC from the host circuit 410. The memory circuit 420 may drive the input/output pad DQ according to the data driving cycle information INF_C.

Figure 5:
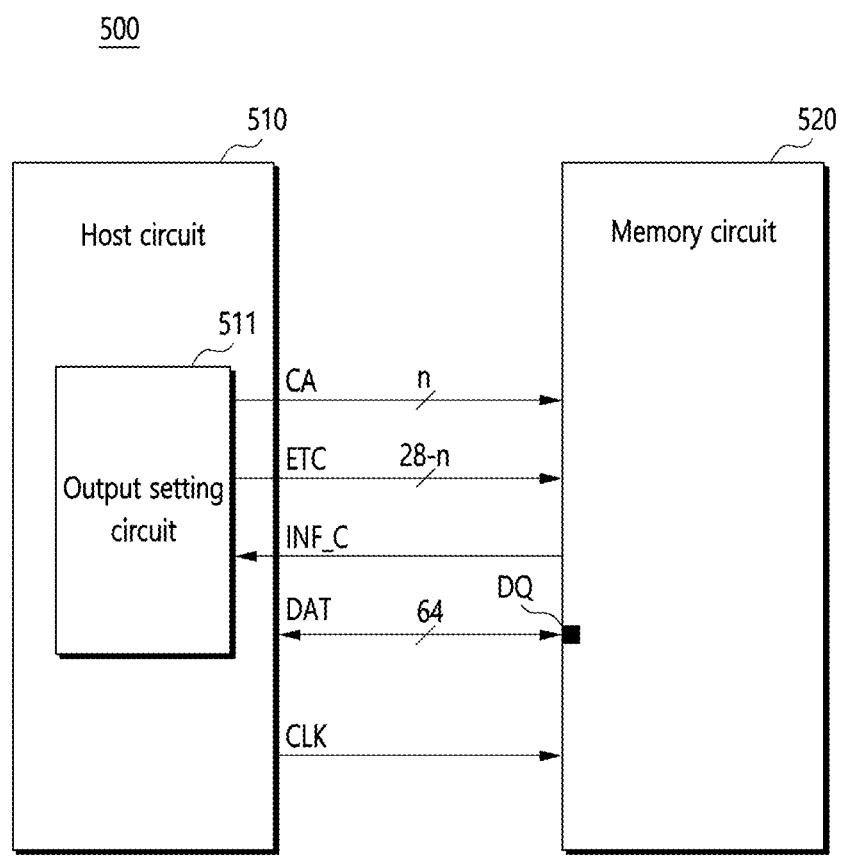
FIG. 5 is a block diagram illustrating a memory system in accordance with an embodiment.

FIG. 5 is a block diagram illustrating a memory system 500 in accordance with an embodiment.

Referring to FIG. 5, the memory system 500 may include a host circuit 510 and a memory circuit 520. The memory circuit 520 may provide data driving cycle information INF_C to the host circuit 510.

The host circuit 510 may be configured to control an input/output operation of the memory circuit 520. The host circuit 510 may transfer a command-address signal CA with a bandwidth controlled based on the data driving cycle information INF_C. The host circuit 510 may include an output setting circuit 511.

The output setting circuit 511 may be configured to set a bandwidth of each of the command-address signal CA and an additional signal ETC based on the data driving cycle information INF_C. As described above, the host circuit 510 may transfer the command-address signal CA with the bandwidth controlled based on the data driving cycle information INF_C. Accordingly, the output setting circuit 511 may set and output the bandwidth of the command-address signal CA. Further, the output setting circuit 511 may set and output the bandwidth of the additional signal ETC.

Figure 6:
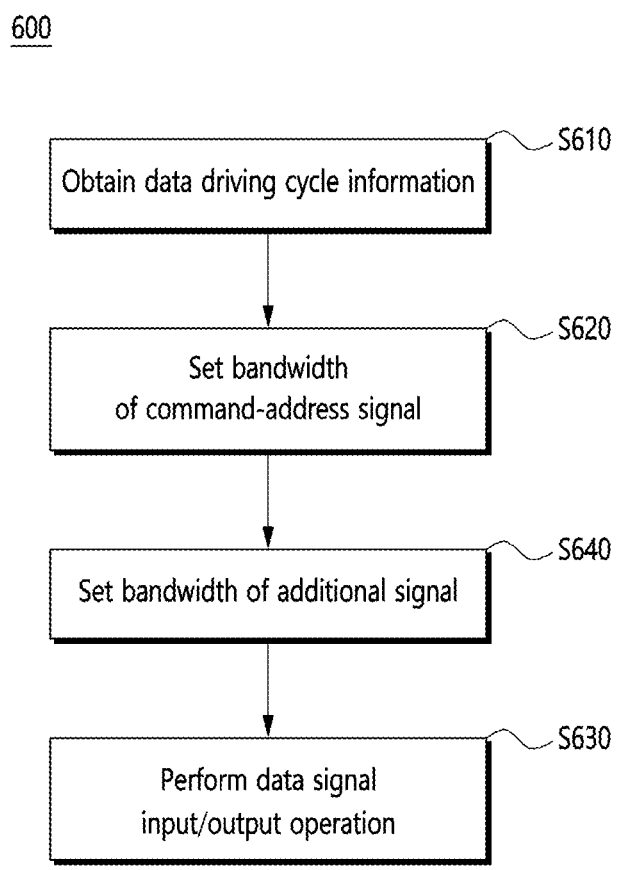
FIG. 6 is a flowchart illustrating a method of operating a memory system in accordance with an embodiment.

FIG. 6 is a flowchart illustrating a method 600 of operating a memory system in accordance with an embodiment.

Referring to FIG. 6, the method 600 of operating the memory system may include obtaining data driving cycle information (S610), setting a bandwidth of a command-address signal based on the data driving cycle information (S620), and performing an input/output operation of a data signal with the bandwidth of the command-address signal (S630).

Hereinafter, for the sake of convenience in explanation, description will be made by taking the memory system 500 of FIG. 5 as an example.

The obtaining of the data driving cycle information (S610) may be performed by the host circuit 510, and may include obtaining the data driving cycle information INF_C for the memory circuit 520. As illustrated in FIG. 5, the host circuit 510 may receive the data driving cycle information INF_C from the memory circuit 520.

The setting of the bandwidth of the command-address signal (S620) may be performed by the host circuit 510, and may include setting the bandwidth of the command-address signal CA based on the data driving cycle information INF_C. As described above with reference to FIGS. 2 and 3, an input time of a command signal may be derived by performing a calculation based on the data driving cycle information INF_C and the number of command signals. In addition, the bandwidth of the command-address signal CA may be derived by performing a calculation based on a maximum bandwidth of the command-address signal CA and the input time of the command signal. That is to say, the setting of the bandwidth of the command-address signal (S620) may include performing a first calculation based on the data driving cycle information INF_C and the number of command signals and performing a second calculation based on the maximum bandwidth of the command-address signal CA and a result of performing the first calculation.

The performing of the input/output operation of the data signal (S630) may be performed by the memory circuit 520, and may include performing the input/output operation of the data signal DAT based on the command-address signal CA.

The method 600 may further include setting a bandwidth of an additional signal (S640). When setting a bandwidth of an additional signal (S640), a bandwidth of the additional signal ETC may be set based on a result of setting the bandwidth of the command-address signal CA. As can be seen from FIG. 5, the host circuit 510 may set the bandwidth of the command-address signal CA to n, and accordingly, may set the bandwidth of the additional signal ETC to 28-n.

As described above, in accordance with embodiments, a memory system may set a bandwidth of a command-address signal CA based on data driving cycle information INF_C. The memory system may set a bandwidth of an additional signal ETC depending on the bandwidth of the command-address signal CA.

As is apparent from the above description, according to the embodiments, by controlling the bandwidth of the command-address signal transferred from a host circuit to a memory circuit, the utilization efficiency of a plurality of transmission lines coupled between the host circuit and the memory circuit may be improved.

While various embodiments have been described above, it will be understood to those skilled in the art that the embodiments described are examples only. Accordingly, the memory system and the operating method thereof described herein should not be limited based on the described embodiments.

What is claimed is:

1. A memory system comprising:
    a host circuit configured to control a bandwidth of a command-address signal based on data driving cycle information and transfer, to a memory circuit, the command-address signal with the bandwidth; and
    the memory circuit configured to perform an input/output operation of a data signal based on the command-address signal and the data driving cycle information.

2. The memory system according to claim 1, wherein the data driving cycle information includes information on a time during which the data signal occupies an input/output pad when the data signal is driven to the input/output pad.

3. The memory system according to claim 2, wherein the time during which the data signal occupies the input/output pad includes a time corresponding to at least one of a number of command signals and a burst length.

4. The memory system according to claim 1, further comprising:
    a plurality of transmission lines coupled between the host circuit and the memory circuit and transferring the command-address signal and additional signals,
    wherein the plurality of transmission lines correspond to a maximum bandwidth of the command-address signal, and
    wherein a number of additional signals is less than the maximum bandwidth.

5. The memory system according to claim 1, wherein the host circuit adjusts a bandwidth of the command-address signal depending on a number of command signals to be transferred to the memory circuit.

6. The memory system according to claim 1, wherein the memory circuit comprises:
    a path control circuit configured to control output paths of the command-address signal based on the data driving cycle information;
    a latching circuit configured to latch the command-address signal outputted from the path control circuit;
    a decoding circuit configured to generate a command signal and an address signal by decoding an output signal of the latching circuit; and
    an input/output circuit configured to input/output the data signal based on the data driving cycle information.

7. A memory system comprising:
    a memory circuit configured to provide data driving cycle information; and
    a host circuit configured to control an input/output operation of a data signal, which is performed by the memory circuit, and transfer, to the memory circuit, a command-address signal with a bandwidth controlled based on the data driving cycle information that is provided by the memory circuit.

8. The memory system according to claim 7, wherein the data driving cycle information includes a time during which the data signal occupies an input/output pad when the data signal is driven to the input/output pad.

9. The memory system according to claim 7, further comprising:
    a plurality of transmission lines coupled between the host circuit and the memory circuit and transferring the command-address signal and additional signals,
    wherein the plurality of transmission lines correspond to a maximum bandwidth of the command-address signal, and
    wherein the number of additional signals is less than the maximum bandwidth.

10. The memory system according to claim 9, wherein the host circuit comprises:
    an output setting circuit configured to set a bandwidth of each of the command-address signal and the additional signals based on the data driving cycle information.

11. The memory system according to claim 7, wherein the host circuit adjusts a bandwidth of the command-address signal depending on a number of command signals to be transferred to the memory circuit.

12. A method for operating a memory system including a host circuit and a memory circuit, the method comprising:
    obtaining, by the host circuit, data driving cycle information for the memory circuit;
    setting, by the host circuit, a bandwidth of a command-address signal based on the data driving cycle information;
    transferring, by the host circuit, the command-address signal with the bandwidth to the memory circuit; and
    performing, by the memory circuit, an input/output operation of a data signal based on the command-address signal.

13. The method according to claim 12, wherein the data driving cycle information includes information on a time during which the data signal occupies an input/output pad when the data signal is driven to the input/output pad.

14. The method according to claim 12, further comprising transferring, by the host circuit, additional signals to the memory circuit, wherein a number of additional signals is less than a maximum bandwidth of the command-address signal.

15. The method according to claim 12, wherein the setting of the bandwidth of the command-address signal comprises:
    performing a first calculation based on the data driving cycle information and a number of command signals to be transferred to the memory circuit; and
    performing a second calculation based on a maximum bandwidth of the command-address signal and a result of the first calculation.

16. The method according to claim 12, further comprising:
    setting, by the host circuit, a bandwidth of an additional signal based on a result of setting the bandwidth of the command-address signal; and
    transferring, by the host circuit, the additional signal to the memory circuit.

* * * * *